United States Patent
Koike et al.

(10) Patent No.: US 11,204,524 B2
(45) Date of Patent: Dec. 21, 2021

(54) IMAGE DISPLAY DEVICE

(71) Applicant: Dai Nippon Printing Co., Ltd., Tokyo (JP)

(72) Inventors: Yasuhiro Koike, Kanagawa (JP); Takashi Kuroda, Tokyo (JP); Kana Yamamoto, Tokyo (JP)

(73) Assignees: Dai Nippon Printing Co., Ltd., Tokyo (JP); Yasuhiro Koike, Kanagawa (JP)

( * ) Notice: Subject to any disclaimer, the term of this patent is extended or adjusted under 35 U.S.C. 154(b) by 47 days.

(21) Appl. No.: 16/068,044

(22) PCT Filed: Jan. 5, 2017

(86) PCT No.: PCT/JP2017/000090
§ 371 (c)(1),
(2) Date: Jul. 3, 2018

(87) PCT Pub. No.: WO2017/119427
PCT Pub. Date: Jul. 13, 2017

(65) Prior Publication Data
US 2020/0050039 A1 Feb. 13, 2020

(30) Foreign Application Priority Data

Jan. 8, 2016 (JP) .................................. 2016-003057
Jan. 8, 2016 (JP) ............................. JP2016-003056

(51) Int. Cl.
*G02F 1/13363* (2006.01)
*G02B 5/30* (2006.01)
*G02F 1/1335* (2006.01)

(52) U.S. Cl.
CPC ....... *G02F 1/13363* (2013.01); *G02B 5/3083* (2013.01); *G02F 1/133504* (2013.01);
(Continued)

(58) Field of Classification Search
None
See application file for complete search history.

(56) References Cited

U.S. PATENT DOCUMENTS

2007/0200987 A1\* 8/2007 Yoda .................... G02B 5/3016
349/119
2008/0100551 A1 5/2008 Haga et al.
(Continued)

FOREIGN PATENT DOCUMENTS

CN 101040214 9/2007
CN 101320108 12/2008
(Continued)

*Primary Examiner* — Anthony J Frost
(74) *Attorney, Agent, or Firm* — Hamre, Schumann, Mueller & Larson, P.C.

(57) ABSTRACT

The present invention aims to provide an image display device including an optical film having a thickness suitable for practical use without including any special inorganic material, wherein the image display device has high color rendering properties and is capable of minimizing the occurrence of blackout and interference colors (rainbow unevenness) even when the image display device includes light sources that emit light having a narrow emission spectrum. The present invention provides an image display device including an optical film having an in-plane birefringence and a polarizer in this order, wherein the optical film and the polarizer are disposed to form an angle of about 45° between a slow axis of the optical film and an absorption axis of the polarizer, the optical film has a retardation of 3000 nm or more, and light incident on the optical film provides at least 50% coverage of ITU-R BT.2020.

6 Claims, 8 Drawing Sheets

(52) U.S. Cl.
CPC .... *G02F 1/133528* (2013.01); *C09K 2323/00* (2020.08); *C09K 2323/03* (2020.08); *G02F 2202/40* (2013.01)

(56) References Cited

U.S. PATENT DOCUMENTS

| | | |
|---|---|---|
| 2010/0091215 A1 | 4/2010 | Fukunaga et al. |
| 2012/0147300 A1 | 6/2012 | Fukuda et al. |
| 2012/0229732 A1* | 9/2012 | Koike ............... G02F 1/13363 349/69 |
| 2013/0100378 A1 | 4/2013 | Murata et al. |
| 2015/0316696 A1 | 11/2015 | Kamijo et al. |

FOREIGN PATENT DOCUMENTS

| | | | |
|---|---|---|---|
| CN | 102959459 | 3/2013 | |
| CN | 104641268 | 5/2015 | |
| EP | 1 770 415 | 4/2007 | |
| EP | 2 853 995 | 4/2015 | |
| JP | 10-010522 | 1/1998 | |
| JP | 2005-157082 | 6/2005 | |
| JP | 2011-107198 | 6/2011 | |
| JP | 2011-215646 | 10/2011 | |
| JP | 2014-015035 | 1/2014 | |
| JP | 2015-129893 | 7/2015 | |
| JP | 2015-194637 | 11/2015 | |
| JP | 2015194637 A * | 11/2015 | ....... G02F 1/133514 |
| JP | 2015-215577 | 12/2015 | |
| JP | 2017-122903 | 7/2017 | |
| JP | 2017-122904 | 7/2017 | |
| WO | 2011/162198 | 12/2011 | |
| WO | 2013/100041 | 7/2013 | |

\* cited by examiner

IMAGE DISPLAY DEVICE

TECHNICAL FIELD

The present invention relates to an image display device.

BACKGROUND ART

Rapid progress has been made in display devices such as liquid crystal display devices in terms of properties such as luminance, resolution, and color gamut. The progress in such properties has led to a proportional increase in the number of image display devices for in-vehicle use, such as car navigation systems and instrument panels, and for outside use, such as portable information terminals and digital signage displays that are used in all kinds of places including outside, stores, public spaces, and transportation systems.

In an environment with strong sunlight such as outside, image display devices may be viewed through sunglasses with a polarization function (hereinafter referred to as "polarized sunglasses") in order to reduce glare.

Image display devices such as liquid crystal display devices usually include a polarizing plate. When an absorption axis of the polarizing plate coincides with an absorption axis of the polarized sunglasses while a display screen of such an image display device including a polarizing plate is viewed through polarized sunglasses, the display screen unfortunately becomes dark and images become invisible (hereinafter referred to as "blackout"). Well-known examples of image display devices, other than liquid crystal display devices, include organic electroluminescence (organic EL) display devices. Blackout occurs in the organic EL display devices because these devices also include a polarizing plate (circularly polarizing plate) on the viewing side of an organic EL element in order to prevent a reduction in contrast (photopic contrast) of a displayed image due to reflection of external light.

As a measure against blackout, Patent Literature 1, for example, discloses a liquid crystal display device including white light-emitting diodes as light sources that emit light having a continuous and wide emission spectrum and a polarizing plate on a viewing side of a liquid crystal cell, wherein the polarizing plate includes, on its viewing side, a polymer film (polyester film) having a retardation of 3000 to 30000 nm, and an angle between a slow axis of the polymer film and an absorption axis of the polarizing plate is about 45 degrees. The arrangement of such a polarizing plate having a high retardation on the viewing side of the polymer film can eliminate blackout. The invention disclosed in Patent Literature 1 also provides a liquid crystal display device including white light-emitting diodes (white LEDs) as light sources of a backlight, wherein a polymer film having a high retardation is used to prevent the occurrence of interference colors (rainbow unevenness) specifically associated with the retardation value of conventional polymer films.

In the case of an image display device including light sources that emit light having a continuous and wide emission spectrum as described in Patent Literature 1, it suffices as long as the image display device includes a polymer film having a retardation of 3000 nm or more as a protective layer disposed on the viewing side of the polarizing plate, and there is no upper limit to the value. In the invention disclosed in Patent Literature 1, the upper limit of the retardation of the polymer film is set to 30000 in terms of handling because a higher retardation entails an increase in the film thickness. FIG. 2 shows an emission spectrum of light from white LEDs.

In contrast, in the case of an image display device including light sources that emit only light having a discontinuous emission spectrum with a peak at a specific wavelength as in a CCFL, the image display device must be provided with a special inorganic material having a retardation exceeding 100000 nm as a protective layer in order to eliminate blackout and interference colors (rainbow unevenness) (for example, see Patent Literature 2). FIG. 3 shows an emission spectrum of light from CCFLs.

Recent image display devices are required to have higher color rendering properties (i.e., wider color gamut). Attempts to provide higher color rendering properties are made using light having a narrower emission spectrum (light having an emission spectrum with a peak at a specific wavelength) than light having a continuous and wide emission spectrum emitted from white LEDs.

When the image display device includes light sources that emit light having a narrower emission spectrum than light having a continuous and wide emission spectrum emitted from white LEDs, a reduction in the occurrence of blackout and interference colors (rainbow unevenness) requires a special material having a very high retardation exceeding 100000 nm as a protective layer of a polarizing plate. Meanwhile, attempts to achieve such a high retardation using a polymer film entail an increase in the film thickness, and such a thick polymer film may be unsuitable for practical use in devices for which thickness reduction is required.

CITATION LIST

Patent Literature

Patent Literature 1: JP 2011-107198 A
Patent Literature 2: JP H10-10522 A

SUMMARY OF INVENTION

Technical Problem

In view of the current situation described above, the present invention aims to provide an image display device that can include an optical film having a thickness suitable for practical use in devices for which thickness reduction is required, without including any special inorganic material, wherein the image display device has high color rendering properties and is capable of minimizing the occurrence of blackout and interference colors (rainbow unevenness) even when the image display device includes light sources that emit light having a narrow emission spectrum.

Solution to Problem

The present invention provides an image display device including an optical film having in-plane birefringence and a polarizer in this order, wherein the optical film and the polarizer are disposed to form an angle of about 45° between a slow axis of the optical film and an absorption axis of the polarizer, the optical film has a retardation of 3000 nm or more, and light incident on the optical film provides at least 50% coverage of ITU-R BT.2020.

Preferably, in the image display device of the present invention, the optical film has a light transmittance of 20% or higher at a wavelength of a maximum peak intensity in a wavelength range from 580 nm to 780 nm.

Preferably, in the image display device of the present invention, the optical film has a light transmittance of 20 to 80% at a wavelength of a maximum peak intensity in a wavelength range from 580 nm to 780 nm.

Preferably, light incident on the optical film is light produced by a blue light-emitting diode, a red phosphor, and a green and/or yellow phosphor, and the red phosphor is a fluoride complex phosphor activated with $Mn^{4+}$.

Preferably, in the image display device of the present invention, light incident on the optical film is light emitted from an organic electroluminescence element.

Preferably, in the image display device of the present invention, light incident on the optical film has an emission spectral peak in each of the following regions: a red region with a wavelength range from 580 nm to 780 nm; a green region with a wavelength range from 480 nm to less than 580 nm; and a blue region with a wavelength range from 380 nm to less than 480 nm, and the half width of the emission spectral peak in the red region is 70 nm or less, the half width of the emission spectral peak in the green region is 60 nm or less, and the half width of the emission spectral peak in the blue region is 40 nm or less.

The present invention is described in detail below.

In image display devices including an optical film having an in-plane birefringence and a polarizer which are layered on each other, the present inventors adjusted retardation of the optical film and the layout angle of the optical film relative to the polarizer to be within a predetermined ranges, and specified light incident on the optical film. As a result, they found that it is possible to provide an image display device including an optical film having a thickness suitable for practical use without including any special inorganic material, wherein the image display device has high color rendering properties and has excellent properties to prevent blackout and interference colors (rainbow unevenness). The present invention was thus completed.

The present invention provides an image display device including an optical film having an in-plane birefringence and a polarizer in this order.

The image display device of the present invention may include a λ/4 phase difference film disposed on the side opposite to the optical film side of the polarizer. Examples of the λ/4 phase difference film that can be used include stretched films, application type films including liquid crystal materials, and like other known films.

The polarizer is, for example, sandwiched between the λ/4 phase difference film and the optical film having an in-plane birefringence, and may be any type of a polarizer having a function that allows only light with a specific vibration direction to pass therethrough. Examples thereof include a PVA polarizer obtained by stretching a PVA film and dyeing the PVA film with iodine dye, dichroic dye, or the like; a polyene polarizer such as a dehydrated product of PVA or a hydrochloric acid-treated product of polyvinyl chloride; a reflective polarizer using a cholesteric liquid crystal; and a thin crystalline film polarizer. The PVA polarizer is particularly preferred.

Examples of the PVA polarizer include one obtained by allowing a dichroic substance (such as iodine or a dichroic dye) to adsorb to a hydrophilic polymer film (such as a PVA film, a partially formalized polyvinyl alcohol film, or a partially saponified ethylene-vinyl acetate copolymer film) and then uniaxially stretching the film. In particular, a polarizer containing a PVA film and a dichroic substance (such as iodine) is preferably used.

The thickness of the polarizer is not particularly limited, and is generally about 1 to 100 μm.

Especially when the polarizer is used in an organic EL display device, the polarizer is not limited to a conventional iodine polarizer and it may be an application type polarizer, such as a lyotropic liquid crystal polarizer or dichroic guest-host polarizer, in order to provide compatibility with flexibility.

The optical film having an in-plane birefringence is not particularly limited. Examples thereof include films made of polycarbonate, cycloolefin polymer, acrylic resin, and polyester. In particular, those having a positive birefringence are preferred in terms of cost and mechanical strength. The expression "having a positive birefringence" means that the refractive index in a direction of a polarization axis is higher than the refractive index in a direction orthogonal to the direction of the polarization axis. Specifically, a polyester substrate is preferred.

The following description is provided on the premise that the optical film having an in-plane birefringence is a polyester substrate.

The polyester substrate has a retardation of 3000 nm or more. If the retardation is less than 3000 nm, blackout or color unevenness (hereinafter also referred to as "interference colors") will occur in a display image of the image display device of the present invention. In contrast, the upper limit of the retardation of the polyester substrate is not particularly limited in terms of blackout and interference colors. If the retardation of the polyester substrate exceeds 40000 nm, the polyester substrate becomes considerably thick and may be unsuitable for practical use in devices for which thickness reduction is required. However, in the case of applications for digital signage displays and in-vehicle devices, a very thick plate-like polyester substrate is preferred in some cases. In such a case, the polyester substrate may have a retardation exceeding 100000 nm.

In terms of thickness reduction and properties to prevent blackout and interference colors, the lower limit of the retardation of the polyester substrate is preferably 5000 nm, more preferably 7000 nm. The upper limit thereof is preferably 50000 nm, more preferably 41300 nm, still more preferably 25000 nm, most preferably 20000 nm, for the polyester substrate can be made very thin when the retardation is in the above ranges. As described above, the retardation is not limited as described above when the polyester substrate is used in applications where thickness reduction is not required. In such a case, the retardation of the polyester substrate may be about 100000 nm. Depending on the thickness of the polyester substrate, the retardation may be 150000 nm or 200000 nm, for example.

The retardation is expressed by the following equation, with a refractive index (nx) in a direction (slow axis direction) in which the refractive index is maximum in the plane of the polyester substrate, a refractive index (ny) in a direction (fast axis direction) orthogonal to the slow axis direction, and a thickness (d) of the polyester substrate.

$$\text{Retardation}(Re) = (nx - ny) \times d$$

The retardation can be measured with, for example, "KOBRA-WR" or "PAM-UHR100" available from Oji Scientific Instruments Co., Ltd.

The direction of a polarization axis (direction of a main axis) of the polyester substrate is determined using two polarizing plates, and refractive indexes (nx and ny) of two axes, i.e., the polarization axis and an axis orthogonal to the direction of the polarization axis, are determined with an Abbe refractometer (NAR-4T available from Atago Co., Ltd.). Here, the axis having a higher refractive index is defined as the slow axis. The thickness d of the optical film is measured with, for example, a micrometer (product name: Digimatic Micrometer, available from Mitutoyo Corporation), and the value is expressed in nanometers. The retardation can also be determined by the product of birefringence (nx−ny) and thickness d (nm) of the optical film.

In the present invention, the birefringence (nx−ny) (hereinafter also expressed as Δn) is preferably 0.05 to 0.40. If the Δn is less than 0.05, the effect of reducing blackout may be insufficient, and the film thickness required to obtain the retardation value described above may be increased. In contrast, if the Δn is more than 0.40, the polyester substrate may be easily split, broken, or the like, and its usefulness as an industrial material may be significantly reduced.

The lower limit of the Δn is more preferably 0.07, and the upper limit thereof is more preferably 0.35. If the Δn is more than 0.35, the polyester substrate may have poor durability in a moisture and heat resistance test. For better durability in the moisture and heat resistance test, the upper limit of the Δn is still more preferably 0.30.

Any material that provides the above retardation may be used as the polyester substrate. Examples thereof include linear saturated polyesters synthesized from any of aromatic dibasic acids and ester-forming derivatives thereof, and any of diols and ester-forming derivatives thereof. Specific examples of the polyesters include polyethylene terephthalate, polyethylene isophthalate, polybutylene terephthalate, poly(1,4-cyclohexylene dimethylene terephthalate), and polyethylene-2,6-naphthalate.

The polyester for use in the polyester substrate may be a copolymer of these polyesters, or may be one prepared by mixing one of the polyesters as a main component (for example, a component in an amount of 80 mol % or higher) and one or more other resins each in a small amount (for example, in an amount of 20 mol % or lower). In particular, the polyester is preferably polyethylene terephthalate or polyethylene-2,6-naphthalate because of their good balance of properties such as dynamic properties and optical properties. In particular, the polyester is preferably polyethylene-2,6-naphthalate (PEN).

PEN is preferred because it is very versatile and readily available. According to the present invention, even a very versatile film, such as a PEN film, can be used to obtain an optical film capable of producing an image display device with high image quality. Further, a PEN film is also excellent in transparency and thermal or mechanical properties, its retardation can be controlled by stretching, and its intrinsic birefringence is so high that a high retardation can be relatively easily obtained even when the film is thin.

In addition, an increasing number of recent image display devices are bendable and/or have design on a curved surface. In the case of devices that require flexibility, a material such as polyimide, aramid, polyamide-imide, or a mixture thereof is also preferably preferred.

The polyester substrate may be obtained by any method that provides the above retardation. Examples thereof include a method in which polyester such as the PEN is melted and extruded into a sheet to prepare unstretched polyester, and the unstretched polyester is transversely stretched at the glass transition temperature or higher using a tenter or the like, followed by heat treatment.

The transverse stretching temperature is preferably 80° C. to 130° C., more preferably 90° C. to 120° C. The transverse stretching ratio is preferably 2.5 to 6.0 times, more preferably 3.0 to 5.5 times. A transverse stretching ratio of more than 6.0 times tends to result in a polyester substrate with reduced transparency. A transverse stretching ratio of less than 2.5 times leads to low stretching tension, which may result in a polyester substrate with reduced birefringence and a retardation of less than 3000 nm.

In the present invention, the transverse stretching of the unstretched polyester under the above conditions may be followed by stretching in a flow direction (hereinafter also referred to as machine direction stretching) against the direction of the transverse stretching, using a biaxial stretching tester. In this case, the stretching ratio of the machine direction stretching is preferably not more than two times. With a stretching ratio of the machine direction stretching of more than two times, it may be impossible to adjust the value of Δn to be in the above preferred range.

The temperature during the heat treatment is preferably 100° C. to 250° C., more preferably 180° C. to 245° C.

The retardation of the polyester substrate produced by the above method can be adjusted to 3000 nm or more by, for example, appropriately setting the stretching ratio, stretching temperature, thickness of the polyester substrate to be obtained, or the like. Specifically, for example, a higher stretching ratio, a lower stretching temperature, or a thicker substrate makes it easy to provide a higher retardation. In contrast, a lower stretching ratio, a higher stretching temperature, or a thinner substrate makes it easy to provide a lower retardation.

The polyester substrate needs to have a thickness suitable for practical use when it is used in devices for which thickness reduction is required. Specifically, the thickness is preferably in the range of 10 to 500 μm. The polyester substrate with a thickness of less than 10 μm fails to have a retardation of 3000 nm or more, and tends to have a significant anisotropy of dynamic properties. Thus, the polyester substrate may be easily split, broken, or the like, and its usefulness as an industrial material may be significantly reduced. In contrast, the polyester substrate with a thickness of more than 500 μm may be unsuitable for practical use. Such a polyester substrate may be very rigid and the characteristic flexibility of the polymer film may be reduced. Such a polyester substrate is undesired because its usefulness as an industrial material is significantly reduced. The lower limit of the thickness of the polyester substrate is more preferably 20 μm. The upper limit thereof is more preferably 400 μm, still more preferably 300 μm.

In the case where the polyester substrate is used in devices, such as digital signage devices and in-vehicle devices, for which thickness reduction is not particularly required, the upper limit of the thickness of the polyester substrate may be 10 mm, for example.

The polyester substrate preferably has a light transmittance of 80% or higher, more preferably 84% or higher, in the visible light region. The light transmittance can be measured in conformity with JIS K7361-1 (Plastics—Determination of the total luminous transmittance of transparent materials).

In the present invention, the polyester substrate may be subjected to a surface treatment, such as saponification treatment, glow discharge treatment, corona discharge treatment, ultraviolet (UV) treatment, or flame treatment, within the scope of the present invention.

When an optical film such as the polyester substrate is disposed in the image display device of the present invention, the optical film is disposed to form an angle of about 45° between an absorption axis of the polarizer and a slow axis of the optical film. This provides a high amount of transmitted light regardless of the angle of the polarizing plate such as polarized sunglasses, and prevents blackout. The angle does not have to be strictly 45°, and may be suitably adjusted as needed as long as the effects of the present invention are not impaired. The range of the angle is preferably 30° to 60°, more preferably 40° to 50°.

In the image display device of the present invention, the optical film may be directly layered on an outermost layer of the polarizer, or a conventionally known transparent member may be arranged therebetween, as a method for disposing the optical film on the viewing side of the polarizer under the above-described conditions.

In addition, the optical film may be placed and bonded to an outermost surface on the viewing side of the image display device of the present invention.

When the optical film is disposed directly or via a different transparent member, the optical film may have an adhesive layer in a preferred embodiment. In such a case, the different transparent member may be disposed between the optical film and the polarizer, or may be disposed closer to the viewing side than the optical film.

Preferably, the optical film includes an optical functional layer on the side opposite to the polarizer side, thus forming an optical layered body.

The optical functional layer is not particularly limited as long as it is a hard coat layer having hard coat properties or a layer, such as a low refractive index layer, capable of performing optical functions. The layers such as a hard coat layer and a low refractive index layer are not particularly limited, and can be formed by any conventionally known method.

The hardness of the optical layered body is preferably HB or harder, more preferably H or harder, as measured by a pencil hardness test (load: 4.9 N) in conformity with JIS K5600-5-4 (1999).

The total light transmittance of the optical layered body is preferably 80% or higher. If the total light transmittance is lower than 80%, the color reproducibility or visibility may be impaired or a desired contrast may not be obtained when the optical layered body is placed on an organic EL display device. The total light transmittance is more preferably 90% or higher.

The total light transmittance can be measured by a method in conformity with JIS K-7361, using a haze meter (product number: HM-150, available from Murakami Color Research Laboratory).

The haze of the optical layered body is preferably 1% or lower. If the haze exceeds 1%, desired optical properties cannot be obtained, and the visibility will be reduced when the optical layered body is placed on the image display device.

The haze can be measured by a method in conformity with JIS K-7136, using a haze meter (product number: HM-150, available from Murakami Color Research Laboratory).

In the image display device of the present invention, light incident on the optical film provides at least 50% coverage of ITU-R BT.2020. Such light has a narrow emission spectrum as compared to light emitted from conventional white LEDs. Thus, the image display device of the present invention has high color rendering properties.

The color gamut that can be reproduced by mixing three RGB colors (red, green, blue) is represented by a triangle in the CIE 1931 xy chromaticity diagram. The triangle is formed by determining coordinates of the RGB colors as vertices and connecting these vertices. When the RGB lights each have a sharp emission spectrum, the RGB colors as the vertices have the following coordinates in the CIE 1931 xy chromaticity diagram: a high x value and a low y value for R; a low x value and a high y values for G; and a low x value and a low y value for B. In other words, when the RGB lights each have a sharp emission spectrum, the area of the triangle formed by connecting the coordinates of the RGB colors as vertices in the CIE 1931 xy chromaticity diagram is large and capable of reproducing a wider color gamut.

In the present invention, light incident on the optical film provides at least 50% coverage of ITU-R BT.2020. The coverage of ITU-R BT.2020 refers to a coverage ratio of the area of the triangle of the color gamut of light incident on the optical film to the area of the triangle defined by ITU-R BT.2020 in the CIE 1931 xy chromaticity diagram.

If light incident on the optical film provides lower than 50% coverage of ITU-R BT.2020, the image display device of the present invention will have insufficient color rendering properties. The lower limit of the coverage of ITU-R BT.2020 is preferably 60%, more preferably 65%.

The coverage of ITU-R BT.2020 of light incident on the optical film can be calculated by, for example, determining the coordinates of the RGB colors as vertices of light (using a filter in the case of a liquid crystal display device or white OLEDs, or without using a filter in the case of OLEDs based on the RGB color separation technique), and then determining the coverage ratio of the area of the triangle of the color gamut of light incident on the optical film to the area of the triangle defined by ITU-R BT.2020 in the CIE 1931 xy chromaticity diagram.

Preferably, the optical film of the image display device of the present invention has a light transmittance of 20% or higher at a wavelength of a maximum peak intensity in a wavelength range from 580 nm to 780 nm (hereinafter, the image display device having a light transmittance of 20% or higher at the above wavelength is also referred to as "image display device (1) of the present invention"). If the light transmittance at the above wavelength is lower than 20%, interference colors may occur even when the optical film having the specific retardation described above is disposed at a specific layout angle relative to the polarizer in the image display device (1) of the present invention. The lower limit of the light transmittance at the above wavelength is preferably 40%, and the upper limit thereof is more preferably 60%.

Image display devices such as smartphones are sometimes moved in various directions in the hand of a user during use. When such an image display device is viewed through polarized sunglasses, the difference in color shade, i.e., color difference, is significant between when an absorption axis of the polarized sunglasses and an absorption axis of the polarizer of the image display device are in a parallel Nicols state and when these axes are in a crossed Nicols state, causing problems in some cases.

Thus, preferably, the optical film of the image display device of the present invention has a light transmittance of 20 to 80% at a wavelength of a maximum peak intensity in a wavelength range from 580 nm to 780 nm (hereinafter, the image display device having a light transmittance of 20 to 80% at the above wavelength is also referred to as "image display device (2) of the present invention"). If the transmittance at the above wavelength is lower than 20%, interference colors may occur even when the optical film having the specific retardation described above is disposed at a specific layout angle relative to the polarizer in the image display device (2) of the present invention. In contrast, if the light transmittance at the above wavelength is higher than 80%, the color difference may be significant when a display screen of the image display device (2) of the present invention is viewed from a different direction. In the image display device (2) of the present invention, the lower limit of the light transmittance at the above wavelength is more preferably 40%, and the upper limit thereof is more preferably 60%.

The image display device (2) of the present invention as described above is preferably one in which the direction of the display screen can be flexibly changed (as in a smartphone). In addition, when the image display device (2) as described above is used for a digital signage display, the layout angle can be flexibly changed. For example, one produced as a horizontally long TV can be used as a vertically long image display device by changing the direction by 90 degrees.

Hereinafter, when no distinction is made between the image display device (1) of the present invention and the image display device (2) of the present invention, these image display displays are collectively referred to as "the image display device of the present invention" for the description.

For measurement of the light transmittance of the optical film at the above wavelength, an additional polarizer is disposed on the viewing side of the image display device including the optical film having in-plane birefringence and a polarizer in this order. The light transmittance is measured in the state where an absorption axis of the polarizer and an absorption axis of the additional polarizer are in a parallel Nicols state.

Alternatively, the light transmittance of the optical film at the above wavelength may be determined by simulation as described below.

Specifically, an intensity I of light that passed through the optical film can be expressed by the following equation (A), where $I_0$ is the intensity of light incident on the optical film, Re is the phase difference of the optical film at a wavelength of 590 nm, θ is the angle between the vibration direction of the incident light and the slow axis of the optical film, and $N(\lambda)$ is a value obtained by dividing the birefringence ($\Delta n(\lambda)$) of a material constituting the optical film at a wavelength in the visible light region (wavelength range from 380 nm to 780 nm) by the birefringence ($\Delta n$ (590 nm)) of the material constituting the optical film at a wavelength of 590 nm. It is premised that the light incident on the optical film is linearly polarized light that passed through the polarizer that is located closer to the display element than the optical film.

$$I = I_0 - I_0 \times \sin^2(2\theta) \times \sin^2(\pi \times N(\lambda) \times Re/\lambda) \quad (A)$$

The equation (A) can be expressed by the following equation (B) since e is 45°.

$$I = I_0 - I_0 \times \sin^2(\pi \times N(\lambda) \times Re/\lambda) \quad (B)$$

The light transmittance at a wavelength of a maximum peak intensity in a wavelength range from 580 nm to 780 nm can be calculated from the above equation (B), and the design value of the optical film can also be determined.

The image display device (1) of the present invention described above is preferably used in a fixed state. In the case of the image display device (1) of the present invention that is used in a fixed state, the upper limit of the light transmittance at the above wavelength may be 100%. The reason thereof is described below.

A polarized lens such as polarized sunglasses has an absorption axis oriented in parallel to the horizontal plane. Such a polarization direction is set in order to prevent glare of light reflected from the horizontal plane because the number of s-polarization components is larger than the number of p-polarization components in the light reflected from the horizontal plane. Likewise, the absorption axis of the polarizer disposed in the image display device is also oriented in parallel to the horizontal plane. Thus, the upper limit of the light transmittance in the parallel Nicols state is preferably set to 100%.

In addition, owing to the above-described structure, the image display device (2) of the present invention can reduce changes in frontal color shade (color difference) between when the angle between the absorption axis of the polarized sunglasses and the absorption axis of the polarizer is 0° (parallel Nicols) and when the angle is 90° (crossed Nicols) on a white image displayed in a dark place.

In the image display device of the present invention, light incident on the optical film is light produced using a blue light-emitting diode, a red phosphor, and green and/or yellow phosphor. The red phosphor is preferably a fluoride complex phosphor activated with $Mn^{4+}$.

Specifically, the blue light-emitting diode emits blue light; the green and/or yellow phosphor converts the wavelength of the blue light to emit green light and/or yellow light; the red phosphor converts the wavelength of the blue light to emit red light; and these blue light, green light and/or yellow light, and red light are mixed to emit white light. In particular, the use of the fluoride complex phosphor activated with $Mn^{4+}$ as the red phosphor makes it possible to suitably produce light for obtaining the light transmittance at the above wavelength and the coverage of ITU-R BT.2020 described above.

Specifically, the fluoride complex phosphor activated with $Mn^{4+}$ is preferably a KSF phosphor.

The KSF phosphor refers to a red phosphor represented by a chemical formula of $K_2SiF_6$:Mn. FIG. 1 shows an emission spectrum of light from light sources including a KSF phosphor as the red phosphor. As shown in FIG. 1, when the red phosphor is a KSF phosphor, the emission spectrum in the red region is sharp (half width is narrow) as compared to, for example, the emission spectrum of light from white LEDs shown in FIG. 2, and the color gamut can be increased.

In addition, in the image display device of the present invention, light for obtaining the light transmittance at the above wavelength and the coverage of ITU-R BT.2020 described above is also preferably light emitted from an organic electroluminescence (EL) element.

In this case, the image display device of the present invention is an organic EL display device. The organic EL display device has various advantages such as high visibility due to its self-emissive properties, high impact resistance due to its all-solid display unlike liquid crystal display devices, high response speed, low susceptibility to temperature changes, and wide viewing angle.

The organic EL display device can prevent reflection of external light because it includes the polarizing plate described above.

The organic EL element may have any structure. Examples thereof include a layered structure of anode/organic EL layer/cathode, in which the organic EL layer may have a structure including a light-emitting layer, and an injection layer and a transport layer for injecting electrons and holes (positive holes).

Examples of such an organic EL element and such an organic EL layer include conventionally known ones.

In the image display device of the present invention, light for obtaining the light transmittance at the above wavelength and the coverage of ITU-R BT.2020 described above may be light produced using cyan LEDs and red laser. Such light produced using cyan LEDs and red laser can also be used to obtain the light transmittance at the above wavelength and the coverage of ITU-R BT.2020 described above, and the use of such light can eliminate interference colors.

The cyan LEDs can be obtained using blue LEDs and a green phosphor. The red laser is not particularly limited, and any conventionally known laser can be used.

Light incident on the optical film of the image display device of the present invention has a narrower emission spectrum than that of light emitted from conventional white LEDs as described above. Specifically, preferably, light emitted from the light-emitting elements has a peak in each of the following regions of the emission spectrum: a red region with a wavelength range from 580 nm to 780 nm; a green region with a wavelength range from 480 nm to less than 580 nm; and a blue region with a wavelength range from 380 nm to less than 480 nm, and the half width of the emission spectral peak in the red region is 70 nm or less, the half width of the emission spectral peak in the green region is 60 nm or less, and the half width of the emission spectral peak in the blue region is 40 nm or less. When each color of light incident on the optical film has a half width of the emission spectral peak in the above range, the image display device of the present invention has high color rendering properties.

In addition, the image display device (1) of the present invention is designed such that light transmittance at the above wavelength is 20% or higher, so that interference colors can be minimized even when the image display device includes light sources that emit light having a sharp emission spectrum as in light produced by the KSF phosphor.

In addition, the image display device (2) of the present invention is designed such that the light transmittance at the above wavelength is 20 to 80%, so that interference colors can be minimized even when the image display device includes light sources that emit light having a sharp emission spectrum as in light produced by the KSF phosphor.

More preferably, the half width of the emission spectral peak in the red region is 60 nm or less, the half width of the emission spectral peak in the green region is 50 nm or less, and the half width of the emission spectral peak in the blue region is 30 nm.

The half width of each peak is obtained by, for example, determining the wavelength at an intensity that is half the peak intensity in the green region (a wavelength range from 480 nm to less than 580 nm) (such a wavelength is observed on both the short wavelength side and the long wavelength side of the peak intensity), and determining the difference between the wavelength on the long wavelength side and the wavelength on the short wavelength side.

The image display device of the present invention has a design particularly effective to light having an emission spectrum in which the region with the narrowest half width is the red region, among the blue, green, and red regions. Specifically, in the present invention, the half width of the emission spectrum in the red region is most preferably 30 nm or less. Light emitted from light sources including the KSF phosphor is particularly suitable as the light having such an emission spectrum.

The reason why the focus is on the emission spectrum in the red region is as described below.

FIG. 1 shows an emission spectrum of light from light sources including a KSF phosphor as a red phosphor. FIG. 2 shows an emission spectrum of light from white LEDs. FIG. 4 shows a graph in which the light transmittance is calculated using the equation (A), where θ is 45°, N(λ) is a value obtained by dividing the birefringence of polyethylene terephthalate at a wavelength in the visible light region (wavelength range from 380 nm to 780 nm) by the birefringence of polyethylene terephthalate at a wavelength of 590 nm, and the phase difference Re is 10000 nm between the incident light and light with a wavelength of 590 nm that passed through the optical film. FIG. 5 shows a graph in which a graph combining FIG. 1 and FIG. 4 is superimposed on the graph of FIG. 1. FIG. 6 shows a graph in which a graph combining FIG. 2 and FIG. 4 is superimposed on the graph of FIG. 2.

FIG. 4 shows that the period of changes in the emission spectrum increases as the wavelength increases, due to the influence of the retardation value of the optical film and the wavelength dependence of birefringence. As shown in FIG. 5 and FIG. 6, when the emission spectrum of light from the light sources is superimposed on the light transmittance of the optical film, the emission spectrum is less likely to extend particularly to the red region. This is the reason why the focus is placed on the emission spectrum in the red region.

The image display device of the present invention including the optical film having an in-plane birefringence and the polarizer in this order can be produced by disposing the polarizer and the optical film on the light sources that emit the light described above.

Advantageous Effects of Invention

Owing to the structure described above, the image display device of the present invention has high color rendering properties, and blackout and interference colors (rainbow unevenness) are minimized even when the image display device includes light sources that emit light having a narrow emission spectrum.

Thus, the image display device of the present invention can be suitably used in organic electroluminescence (EL) display devices and liquid crystal display (LCD) devices.

BRIEF DESCRIPTION OF DRAWINGS

FIG. 4 is superimposed on the graph of FIG. 1.

FIG. 4 is superimposed on the graph of FIG. 2.

DESCRIPTION OF EMBODIMENTS

Figure 1:
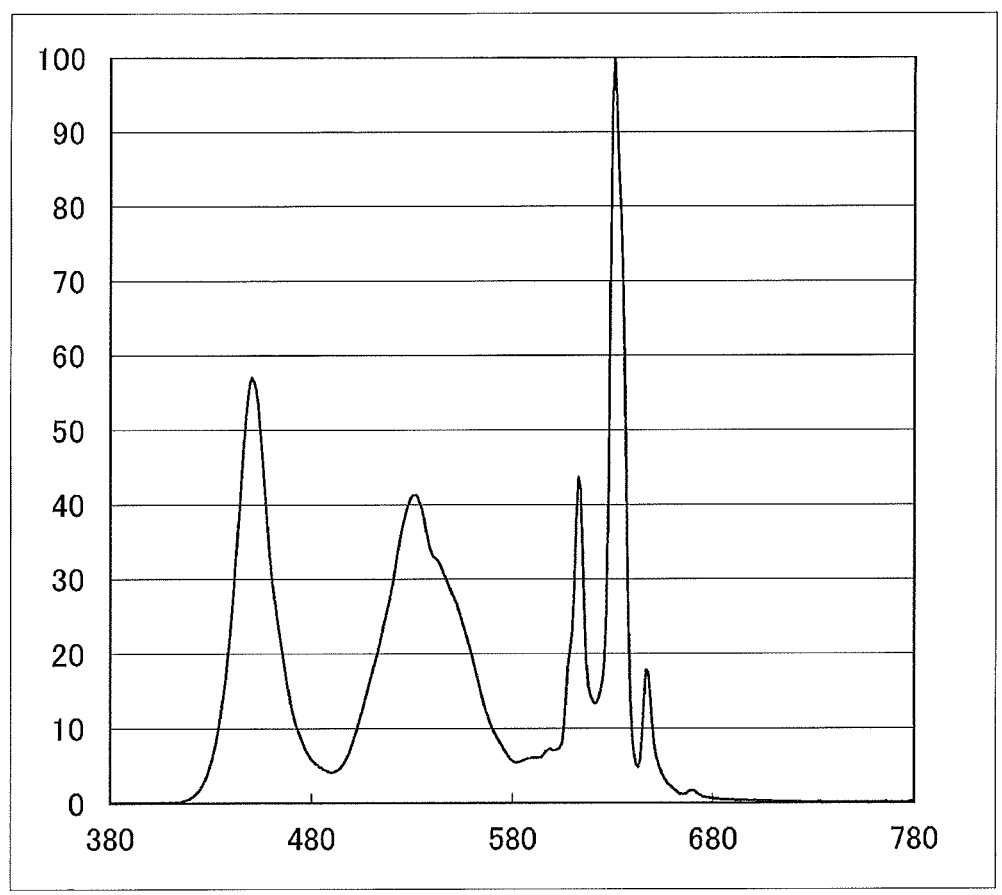
FIG. 1 shows an emission spectrum of light from light sources including a KSF phosphor as a red phosphor.
Figure 2:
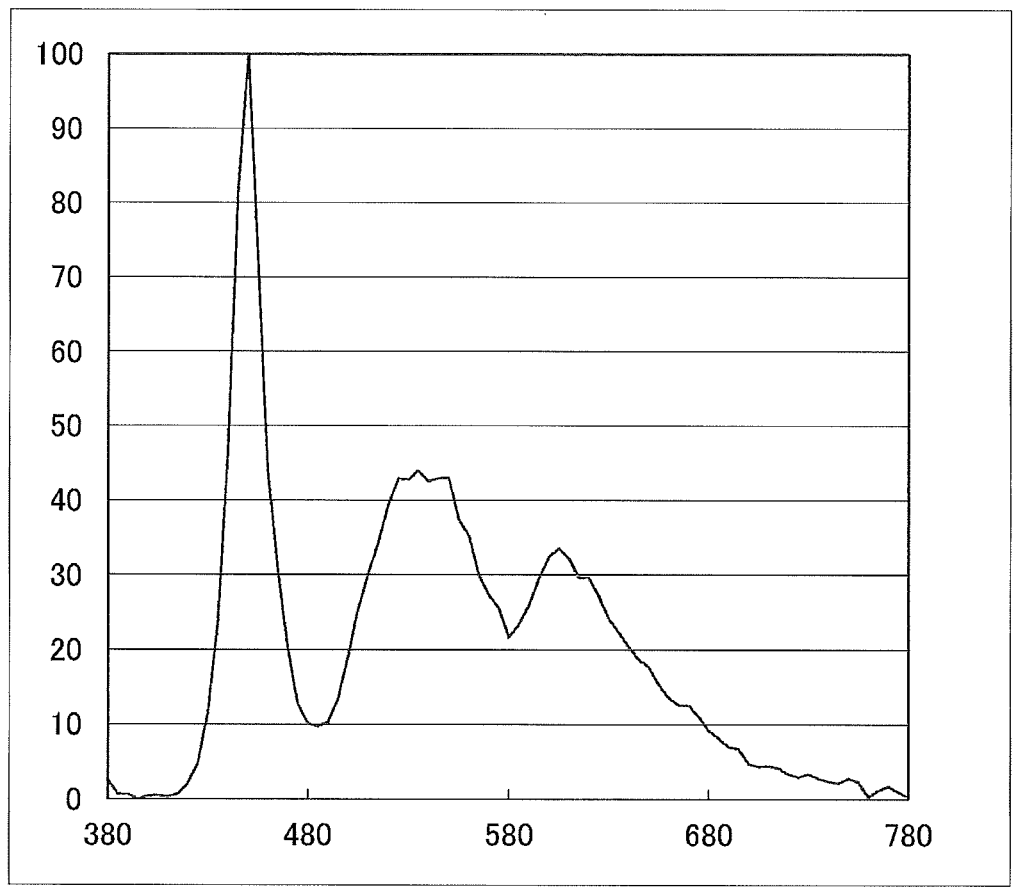
FIG. 2 shows an emission spectrum of light from white LEDs.
Figure 3:
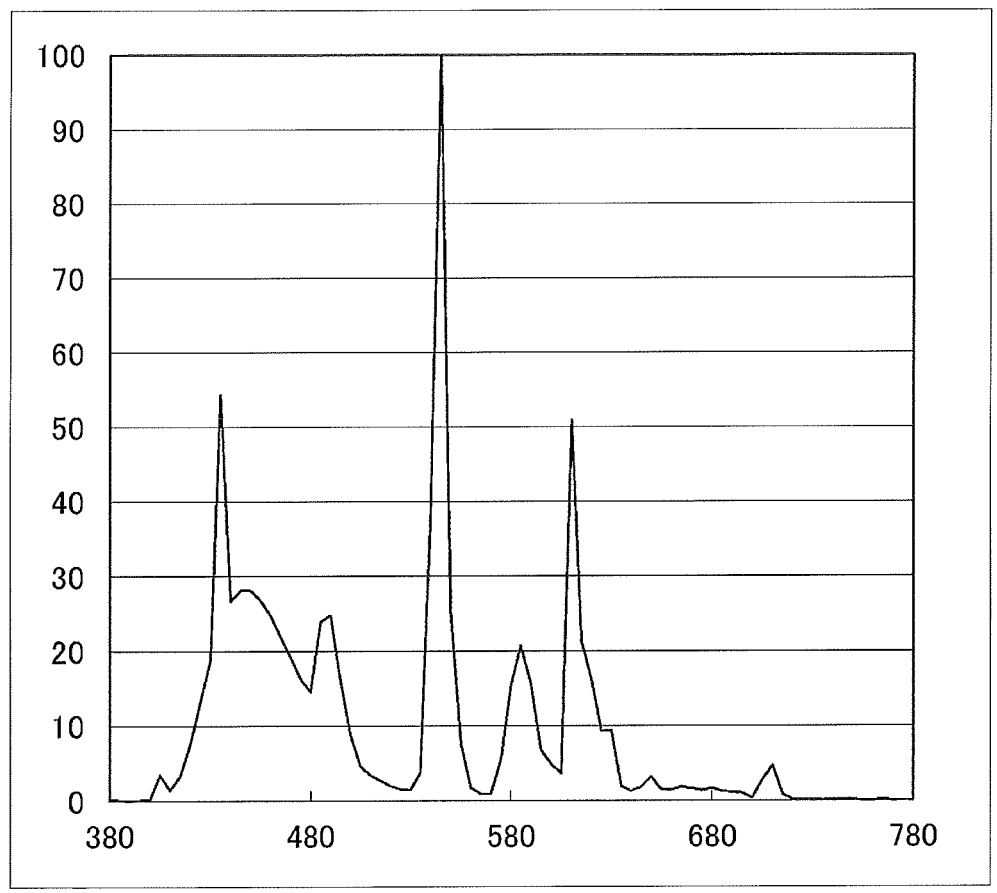
FIG. 3 shows an emission spectrum of light from CCFLs.
Figure 4:
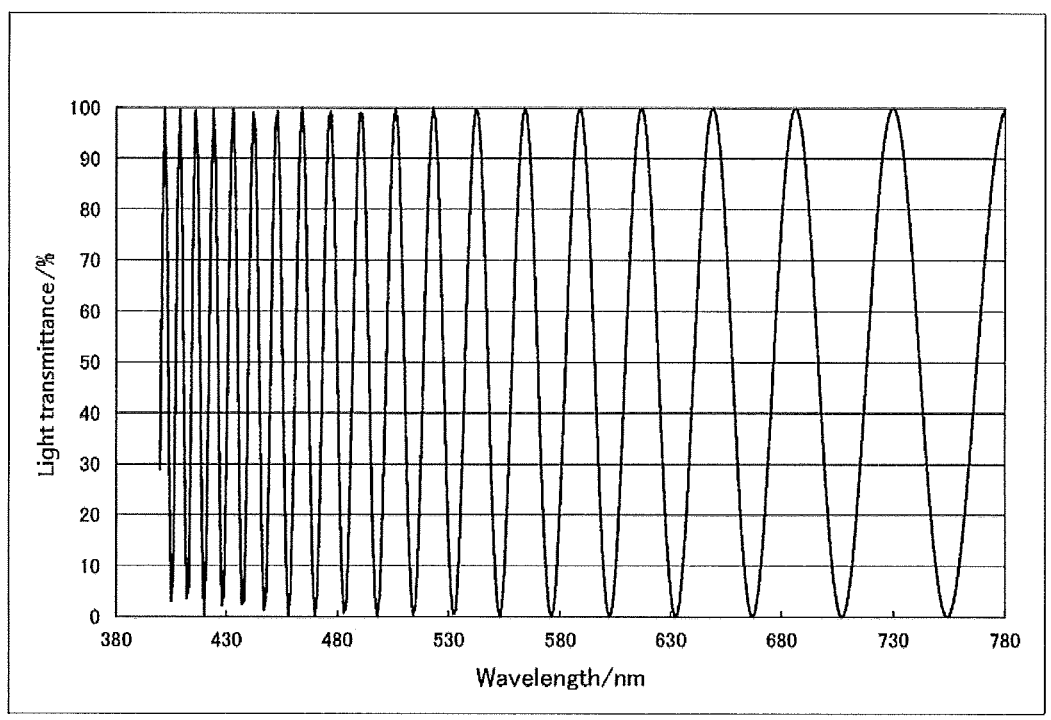
FIG. 4 shows a graph in which the light transmittance is calculated using the equation (A), where θ is 45°, N(λ) is a value obtained by dividing the birefringence of polyethylene terephthalate at a wavelength in the visible light region (wavelength range from 380 nm to 780 nm) by the birefringence of polyethylene terephthalate at a wavelength of 590 nm, and the phase difference Re is 10000 nm between the incident light and light with a wavelength of 590 nm that passed through the optical film.
Figure 5:
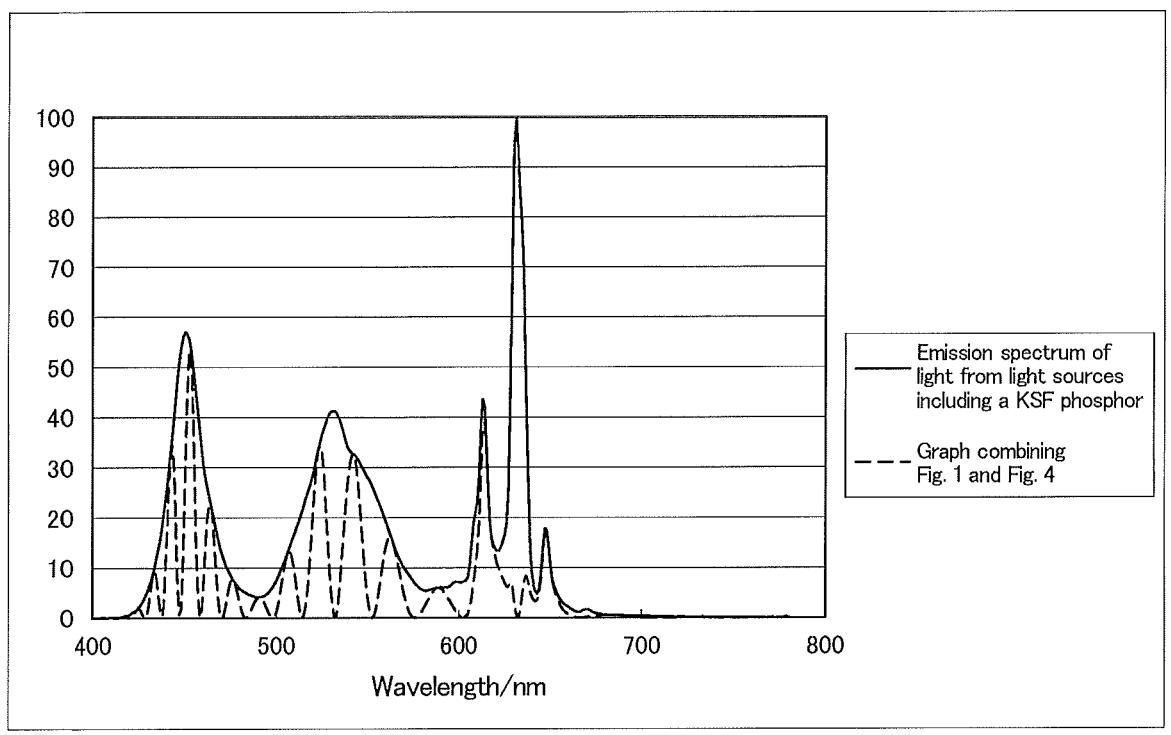
FIG. 5 shows a graph in which a graph combining FIG. 1
Figure 6:
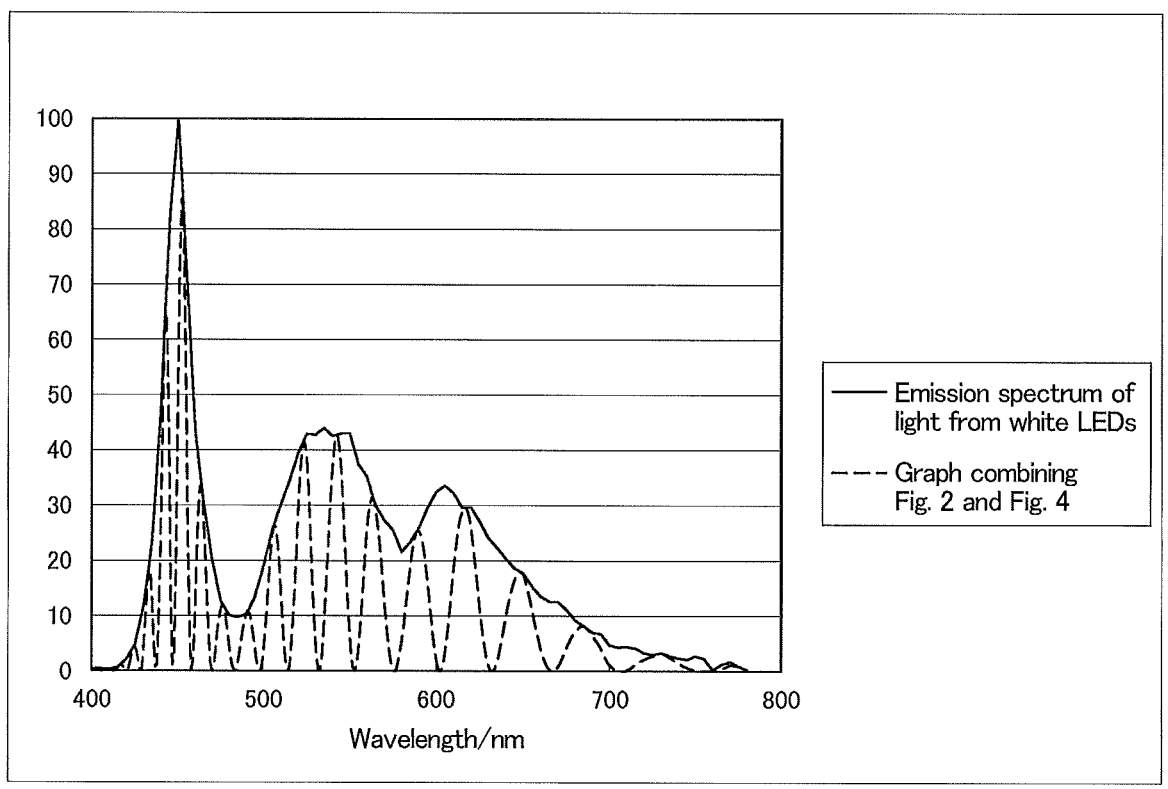
FIG. 6 shows a graph in which a graph combining FIG. 2

The present invention is more specifically described below with reference to examples and comparative examples, but the present invention is not limited to these examples or comparative examples.

The "part(s)" and "%" in the description are part(s) by mass and percent by mass, respectively, unless otherwise specified.

The retardation of a light-transmitting substrate or the like produced in each of the examples and comparative examples was measured as follows.

(Measurement of Retardation)

The retardation of an optical film having a retardation value of less than 20000 nm was measured with PAM-UHR100 available from Oji Scientific Instruments Co., Ltd.

The retardation of an optical film having a retardation value of more than 20000 nm was measured as follows.

First, as for a stretched optical film, the direction of a polarization axis of the optical film was determined using two polarizing plates. The refractive indexes (nx and ny) of two axes, i.e., the polarization axis and an axis orthogonal to the direction of the polarization axis, at a wavelength of 590 nm were determined with an Abbe refractometer (NAR-4T available from Atago Co., Ltd.). Here, the axis having a higher refractive index is defined as the slow axis. The thickness d (nm) of the optical film was measured with a micrometer (Anritsu Corporation), and the value was expressed in nanometers. The retardation was determined by the product of birefringence (nx−ny) and thickness d (nm).

(Measurement of Emission Spectrum of Light Incident on the Optical Film)

The emission spectrum can be measured with a spectrophotometer. During measurement, a white image is displayed on the image display device, and a photoreceiver of the spectrophotometer is placed perpendicular to a light emission surface of the display device, with a viewing angle set at 1°. As a measurement device, a device such as spectroradiometer "CS-2000" available from Konica Minolta, Inc. or a spectroradiometer "SR-LEDW-5N" or "SR-UL2" available from Topcon Corporation can be used.

(Measurement of Color Gamut of Light Incident on the Optical Film)

The color gamut of light incident on the optical film can be reproduced by mixing three RGB colors, and is represented by a triangle in the CIE 1931 xy chromaticity diagram. The triangle is formed by determining coordinates of the RGB colors as vertices and connecting these vertices. The coordinates of the RGB colors as vertices can be measured with a spectrophotometer. During measurement, the RGB colors are each displayed on the image display device, and a photoreceiver of the spectrophotometer is disposed perpendicular to a light emission surface of the image display device, with a viewing angle set at 1°. As a measurement device, a device such as a spectroradiometer "CS-2000" available from Konica Minolta, Inc. or a spectroradiometer "SR-LEDW-5N" or "SR-UL2" available from Topcon Corporation can be used.

Table 1 shows xy data of the RGB colors according to the BT.2020 standard, xy data of the RGB colors of light from iMac Retina 4K having light sources including a KSF phosphor, and xy data of the RGB colors of light from iPhone (registered trademark) 6 Plus having light sources including white LEDs.

(Coverage of BT.2020)

The coverage of the color gamut was determined by calculating the coverage ratio of the area of the triangle of the color gamut of light incident on the optical film to the area of the triangle defined by ITU-R BT.2020 in the CIE 1931 xy chromaticity diagram. Table 1 shows the results.

TABLE 1

|  | BT.2020 | | iMac Retina 4K | | iPhone 6 Plus | |
| --- | --- | --- | --- | --- | --- | --- |
|  | x | y | x | y | x | y |
| R | 0.708 | 0.292 | 0.681 | 0.315 | 0.617 | 0.331 |
| G | 0.17 | 0.797 | 0.263 | 0.694 | 0.299 | 0.603 |
| B | 0.131 | 0.046 | 0.149 | 0.054 | 0.160 | 0.066 |
| Coverage | 100% | | 73% | | 49% | |

(Calculation of Half Width)

The RGB colors were each displayed on iMac Retina 4K having light sources including a KSF phosphor, and the emission spectrum of each region was measured by a method similar to the method for measuring the color gamut of light incident on the optical film. The above measurement was similarly performed using iPhone (registered trademark) 6 Plus having light sources including white LEDs.

Figure 7:
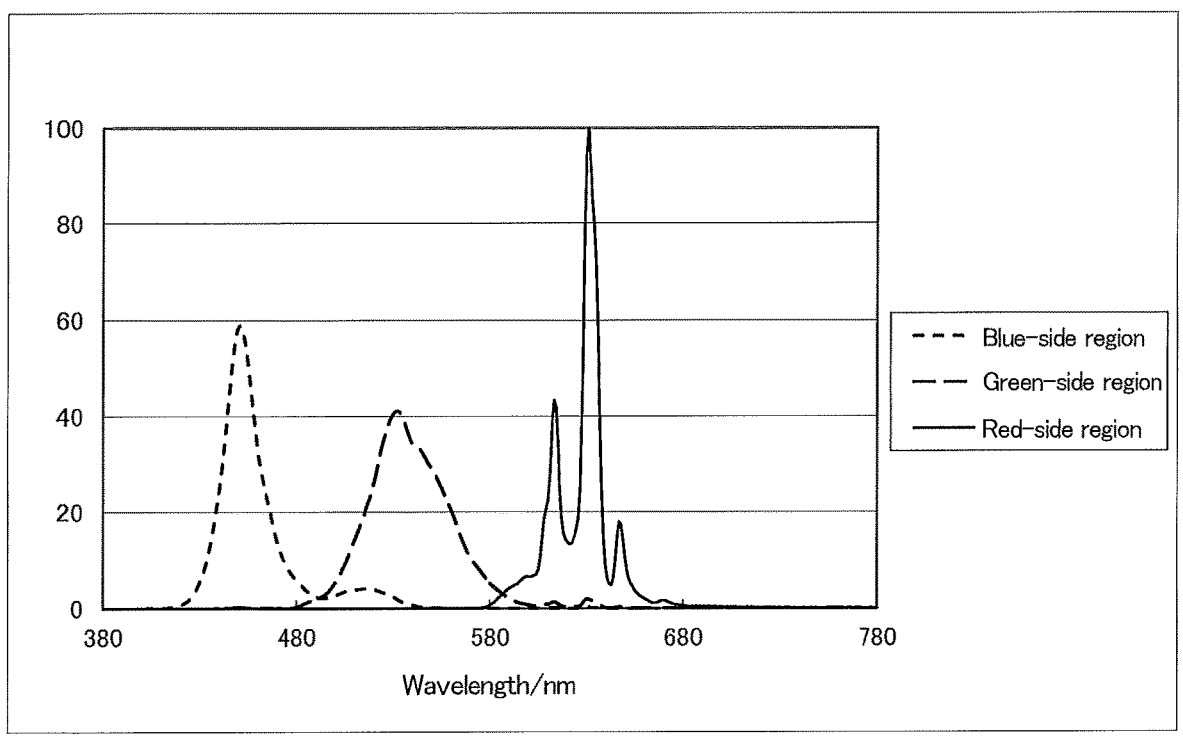
FIG. 7 shows a graph in which spectra of RGB lights of iMac Retina 4K are superimposed.
Figure 8:
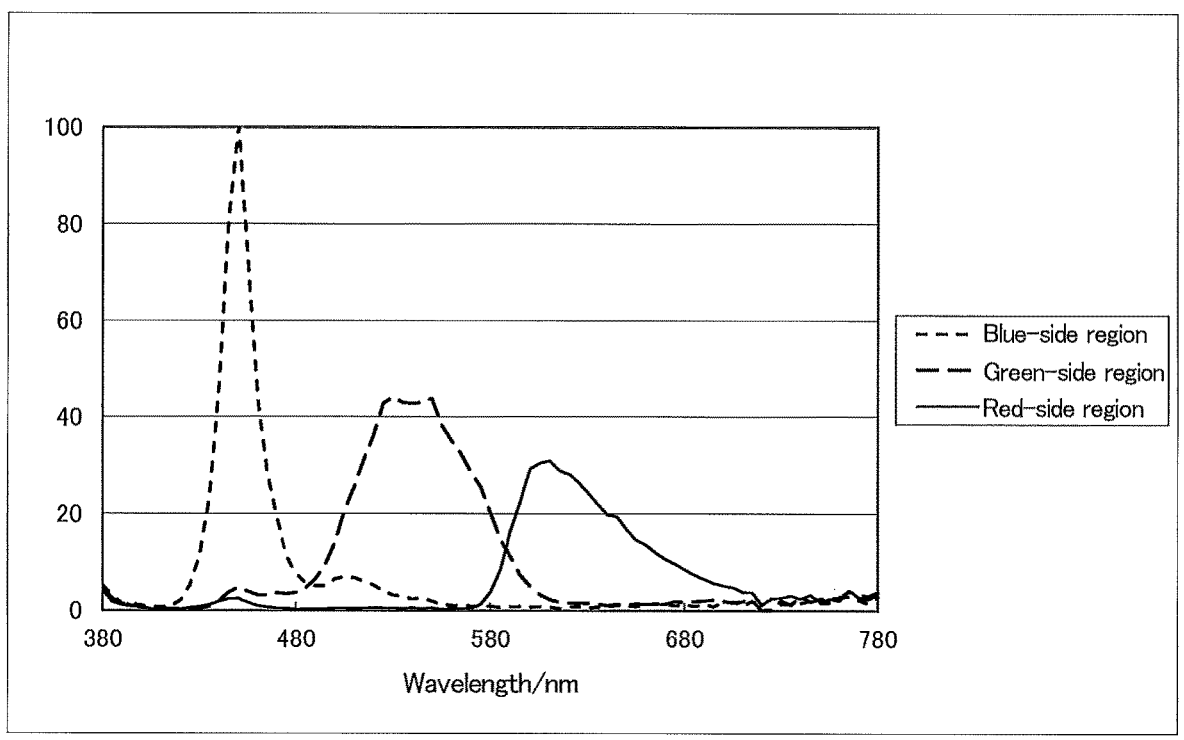
FIG. 8 shows a graph in which spectra of RGB lights of iPhone (registered trademark) 6 Plus are superimposed.

Table 2 shows the peak wavelength (nm) and its half width (nm) of each of the RGB lights from the light sources of each device. FIG. 7 shows a graph in which spectra of the RGB lights from iMac Retina 4K are superimposed. FIG. 8 shows a graph in which spectra of the RGB lights from iPhone (registered trademark) 6 Plus are superimposed.

TABLE 2

|  |  | iMac Retina 4K | iPhone 6 Plus |
| --- | --- | --- | --- |
| Blue-side region | Peak wavelength | 450 | 450 |
|  | Half width | 20 | 19 |
| Green-side region | Peak wavelength | 532 | 530 |
|  | Half width | 45 | 73 |
| Red-side region | Peak wavelength | 630 | 610 |
|  | Half width | 9 | 64 |

(Production of Optical Film)

A polyethylene terephthalate material was melted at 290° C. and extruded through a film-forming die into a sheet form. The sheet was attached to a water-cooled rotary quenching drum for cooling. Thus, an unstretched film was produced.

The unstretched film was pre-heated for one minute at 120° C., stretched at a stretching ratio of 4.5 times at 120° C., and then stretched at a stretching ratio of 1.5 times in a direction perpendicular to the first stretching direction, using a biaxial stretching tester (Toyo Seiki Seisaku-sho, Ltd.). Thus, an optical film having nx of 1.70, ny of 1.60, and a thickness of 15 μm was obtained. The retardation at a wavelength of 590 nm was 1500 nm.

The above method was employed to produce optical films each having a different thickness and a different retardation (retardation=1500 nm, 2000 nm, 3000 nm, 4100 nm, 6000 nm, 8200 nm, 9000 nm, 10000 nm, 11500 nm, 12980 nm, 13300 nm, 25200 nm, 28000 nm, 28300 nm, 36000 nm, 41300 nm, 101000 nm, and 101400 nm).

Examples 1 to 9

In iMac Retina 4K (Apple Inc.) including the KSF phosphor, members disposed closer to the viewing side than the polarizer near the viewing side were removed to calculate the coverage of ITU-R BT.2020 of light incident on the optical film. The result was 73%. The optical films each having a different retardation of 3000 nm, 6000 nm, 8200 nm, 9000 nm, 11500 nm, 13300 nm, 28300 nm, 36000 nm, or 41300 nm were independently bonded closer to the viewing side than the polarizer via an adhesive layer. Thus, the image display devices were produced. The angle between the absorption axis of the polarizer and the slow axis of the optical film was 45°.

Comparative Examples 1 to 17

Image display devices were produced as in Example 1, except for using an optical film having a retardation of 1500 nm (Comparative Example 1) and 2000 nm (Comparative Example 2).

In iPhone (registered trademark) 6 Plus (Apple Inc.) having light sources including white LEDs, members disposed closer to the viewing side than the polarizer close to the viewing side were removed to calculate the coverage of ITU-R BT.2020 of light incident on the optical film. The result was 49%. The optical films each having a different retardation value shown in Table 3 were independently bonded closer to the viewing side than the polarizer via an adhesive layer. Thus, the image display devices according to Comparative Examples 3 to 17 were produced. The angle between the absorption axis of the polarizer and the slow axis of the optical film was set to 45°.

Reference Examples 1 to 4

Image display devices were produced as in Example 1, except for using an optical film having a retardation of 4100 nm (Reference Example 1), 10000 nm (Reference Example 2), 28000 nm (Reference Example 3), and 101400 nm (Reference Example 4).

(Evaluation of Color Shade)

A white image was displayed on each of the image display devices produced, and the color shade was evaluated through polarized sunglasses. The following criteria were applied for evaluation. Here, the absorption axis of the polarizer of the image display device and the polarized sunglasses were in a parallel Nicols state.

Poor: Interference colors are intense.
Adequate: Interference colors are observed but not at the level unsuitable for practical use.
Good: Interference colors are only slightly observed.
Excellent: No interference colors are observed.

(Method for Measuring the Light Transmittance of the Optical Film)

An intensity A of the wavelength of a maximum peak intensity in a wavelength range from 580 nm to 780 nm in each of the image display devices produced in the examples, comparative examples, and reference examples was measured with a spectroradiometer CS-2000 (Konica Minolta, Inc.). Next, an additional polarizer was disposed on the viewing side of each image display device, and an intensity B was measured when the absorption axis of the polarizer and the absorption axis of the additional polarizer were in a parallel Nicols state. Then, the light transmittance was determined by substituting the measured values into the following formula: (intensity B/intensity A)×100. When the light sources including the KSF phosphor were used, the light transmittance was measured at a wavelength of 630 nm as the wavelength of the maximum peak intensity in a wavelength range from 580 nm to 780 nm. When the light sources consisting of the white LEDs were used, the light transmittance was measured at a wavelength of 605 nm as the wavelength of the maximum peak intensity in a wavelength range from 580 nm to 780 nm.

(Evaluation of Color Rendering Properties)

Color images were displayed on the image display devices having different light sources to which the optical films each having the same retardation value were independently bonded. Fifteen people evaluated which image display devices had high color rendering properties.

Good: Eight or more people said that the color rendering properties were excellent.
Poor: Less than eight people said that the color rendering properties were excellent.

TABLE 3

| | Examples | | | | | | | | | Comparative Examples | |
|---|---|---|---|---|---|---|---|---|---|---|---|
| | 1 | 2 | 3 | 4 | 5 | 6 | 7 | 8 | 9 | 1 | 2 |
| Retardation (nm) | 3000 | 6000 | 8200 | 9000 | 11500 | 13300 | 28300 | 36000 | 41300 | 1500 | 2000 |
| Color shade (visual observation) | Adequate | Adequate | Good | Excellent | Excellent | Good | Excellent | Excellent | Adequate | Poor | Poor |
| Light transmittance at a wavelength of 630 nm | 26 | 23 | 55 | 100 | 91 | 37 | 96 | 98 | 34 | 24 | 88 |
| Color rendering properties | Good | Good | Good | Good | Good | Good | Good | Good | Good | Good | Good |

| | Comparative Examples | | | | | | | | |
|---|---|---|---|---|---|---|---|---|---|
| | 3 | 4 | 5 | 6 | 7 | 8 | 9 | 10 | 11 |
| Retardation (nm) | 1500 | 2000 | 3000 | 4100 | 6000 | 8200 | 9000 | 10000 | 11500 |
| Color shade (visual observation) | Poor | Poor | Adequate | Adequate | Good | Good | Excellent | Excellent | Excellent |
| Light transmittance at a wavelength of 605 nm | 2 | 41 | 94 | 42 | 77 | 3 | 53 | 9 | 82 |
| Color rendering properties | Poor | Poor | Poor | Poor | Poor | Poor | Poor | Poor | Poor |

TABLE 3-continued

|  | | Comparative Examples | | | | | |
| --- | --- | --- | --- | --- | --- | --- | --- |
|  |  | 12 | 13 | 14 | 15 | 16 | 17 |
|  | Retardation (nm) | 13300 | 28000 | 28300 | 36000 | 41300 | 101400 |
|  | Color shade (visual observation) | Excellent | Excellent | Excellent | Excellent | Excellent | Excellent |
|  | Light transmittance at a wavelength of 605 nm | 69 | 94 | 7 | 98 | 46 | 33 |
|  | Color rendering properties | Poor | Poor | Poor | Poor | Poor | Poor |

|  | Reference Examples | | | |
| --- | --- | --- | --- | --- |
|  | 1 | 2 | 3 | 4 |
| Retardation (nm) | 4100 | 10000 | 28000 | 101400 |
| Color shade (visual observation) | Poor | Poor | Poor | Excellent |
| Light transmittance at a wavelength of 630 nm | 13 | 5 | 9 | 85 |
| Color rendering properties | Good | Good | Good | Good |

The image display devices according to the examples each had excellent color rendering properties because light incident on the optical film provided at least 50% coverage of ITU-R BT.2020. In addition, blackout did not occur because the optical film had a retardation of 3000 nm or more, and the optical film and the polarizer were disposed to form an angle of about 45° between the slow axis of the optical film and the absorption axis of the polarizer. As shown in Table 3, the occurrence of interference colors was also reduced because the optical film had a light transmittance of 20% or higher at a wavelength of 630 nm.

As shown in Table 3, the image display devices according to Reference Examples 1 to 3 each had sufficient color rendering properties and blackout did not occur; however, unfortunately, interference colors were observed because the optical film had a light transmittance of lower than 20% at a wavelength of 630 nm.

The results of the examples and the reference examples confirm that the color rendering properties were excellent when light incident on the optical film provided at least 50% coverage of ITU-R BT.2020, and blackout was eliminated when the optical film had a retardation of 3000 nm or more and the optical film and the polarizer were disposed to form an angle of about 45° between the slow axis of the optical film and the absorption axis of the polarizer. However, in the case of the light sources including KSF phosphor that emits light having a narrow half width of the emission spectrum in the red region, the optical film needed to have a light transmittance of 20% or higher at a wavelength of 630 nm in order to reliably eliminate interference colors. In addition, although the image display device according to Reference Example 4 had excellent results in terms of color rendering properties, blackout, and interference colors, the optical film was very thick (1014 μm) and was thus unsuitable for practical use when the intended application requires a thin film. Table 5 shows the relationship between birefringence of the optical film and its thickness.

In contrast, in the cases of the image display devices according to the comparative examples, interference colors were unfortunately observed when the retardation of the optical film was less than 3000 nm (Comparative Examples 1, 2, 3, and 4). When the optical film had a retardation of 3000 nm or more and the optical film and the polarizer were disposed to form an angle of about 45° between the slow axis of the optical film and the absorption axis of the polarizer, interference colors and blackout were prevented regardless of the percentage of the light transmittance at a wavelength of 605 nm because the emission spectrum of light incident on the optical film had a wide half width in the red region; however, the light incident on the optical film provided lower than 50% coverage of ITU-R BT.2020, so that the color rendering properties were poor (Comparative Examples 5 to 17).

Examples 10 to 14

In iMac Retina 4K (Apple Inc.) including the KSF phosphor, members disposed closer to the viewing side than the polarizer near the viewing side were removed to calculate the coverage of ITU-R BT.2020 of light incident on the optical film. The result was 73%. The optical films each having a different retardation of 3000 nm, 6000 nm, 8200 nm, 12980 nm, and 25200 nm were independently bonded closer to the viewing side than the polarizer via an adhesive layer. Thus, the image display devices were produced. The angle between the absorption axis of the polarizer and the slow axis of the optical film was set to 45°.

Comparative Examples 18 to 32

Image display devices were produced as in Example 10, except for using an optical film having a retardation of 1500 nm (Comparative Example 18) and 2000 nm (Comparative Example 19).

In iPhone (registered trademark) 6 Plus (Apple Inc.) having light sources including white LEDs, members disposed closer to the viewing side than the polarizer near the viewing side were removed to calculate the coverage of ITU-R BT.2020 of light incident on the optical film. The result was 49%. The optical films each having a different retardation value shown in Table 4 were independently bonded closer to the viewing side than the polarizer via an adhesive layer. Thus, the image display devices according to Comparative Examples 20 to 32 were produced. The angle between the absorption axis of the polarizer and the slow axis of the optical film was set to 45°.

Reference Examples 5 to 10

Image display devices were produced as in Example 10, except for using an optical film having a retardation of 4100 nm (Reference Example 5), 9000 nm (Reference Example 6), 10000 nm (Reference Example 7), 11500 nm (Reference Example 8), 33000 nm (Reference Example 9), and 101000 nm (Reference Example 10).

(Evaluation of Color Shade)

The color shade was evaluated as follows using the image display devices produced in the examples, comparative examples, and reference examples.

Ten people simultaneously observed the frontal color shade when the angle between the absorption axis of the polarized sunglasses and the absorption axis of the polarizing plate was 0° (parallel Nicols) and when the angle was 90° (crossed Nicols) on a white image displayed on each image display device in a dark place. The following criteria were applied for evaluation.

The same evaluation made by the largest number of people was regarded as the observation result.

Poor: Strong interference colors are observed.
Adequate: Interference colors are observed, but there is no problem in practical use.
Good: Interference colors are only slightly observed.
Excellent: No interference colors are observed.

(Method for Measuring the Light Transmittance of the Optical Film)

The intensity A of the wavelength of a maximum peak intensity in a wavelength range from 580 nm to 780 nm in each of the image display devices produced in the examples, comparative examples, and reference examples was measured with a spectroradiometer CS-2000 (Konica Minolta, Inc.). Next, an additional polarizer was disposed on the viewing side of each image display device, and the intensity B was measured when the absorption axis of the polarizer and the absorption axis of the additional polarizer were in a parallel Nicols state. Then, the light transmittance was determined by substituting the measured values into the following formula: (intensity B/intensity A)×100. When the light sources including the KSF phosphor were used, the light transmittance was measured at a wavelength of 630 nm as the wavelength of the maximum peak intensity in a wavelength range from 580 nm to 780 nm. When the light sources consisting of the white LEDs were used, the light transmittance was measured at a wavelength of 605 nm as the wavelength of the maximum peak intensity in a wavelength range from 580 nm to 780 nm.

When the absorption axis of the polarizer and the absorption axis of the additional polarizer were in a crossed Nicols state, the light transmittance were determined similarly by first measuring the intensity A, subsequently measuring an intensity C when the absorption axis of the polarizer and the absorption axis of the additional polarizer were in a crossed Nicols state, and substituting the measured values into the following formula for calculation: (intensity C/intensity A)×100.

(Evaluation of Color Rendering Properties)

Color images were displayed on the image display devices having different light sources to which the optical films each having the same retardation value were independently bonded. Fifteen people evaluated which image display devices had high color rendering properties.

Good: More than eight people said that the color rendering properties were excellent.
Poor: Less than eight people said that the color rendering properties were excellent.

(Determination of Color Difference)

The image display devices produced in the examples, comparative examples, and reference examples were evaluated for color difference as follows.

Ten people simultaneously observed the frontal color shade when the angle between the absorption axis of the polarized sunglasses and the absorption axis of the polarizing plate was 0° (parallel Nicols) and when the angle was 90° (crossed Nicols) on a white image displayed on each image display device in a dark place. The following criteria were applied for evaluation.

The same evaluation made by the largest number of people was regarded as the observation result.

Excellent: No color difference between parallel Nicols and crossed Nicols is observed.
Good: A slight color difference between parallel Nicols and crossed Nicols is observed.
Adequate: A color difference between parallel Nicols and crossed Nicols is observed, but there is no problem in practical use.
Poor: A significant color difference between parallel Nicols and crossed Nicols is observed, and it is impossible to use.

TABLE 4

|  |  | Examples |  |  |  |  | Comparative Examples |  |
|---|---|---|---|---|---|---|---|---|
|  |  | 10 | 11 | 12 | 13 | 14 | 18 | 19 |
| Retardation (nm) |  | 3000 | 6000 | 8200 | 12980 | 25200 | 1500 | 2000 |
| Color shade (visual observation) | Parallel Nicols | Adequate | Adequate | Good | Good | Good | Poor | Poor |
|  | Crossed Nicols | Adequate | Good | Good | Adequate | Good | Poor | Poor |
|  | Determination of color difference | Adequate | Good | Excellent | Good | Excellent | Poor | Poor |
| Light ransmittance at a wavelength of 630 nm | Parallel Nicols | 26 | 23 | 55 | 63 | 55 | 24 | 88 |
|  | Crossed Nicols | 74 | 77 | 45 | 37 | 45 | 76 | 12 |
| Color rendering properties |  | Good | Good | Good | Good | Good | Good | Good |

|  |  | Comparative Examples |  |  |  |  |  |  |  |
|---|---|---|---|---|---|---|---|---|---|
|  |  | 20 | 21 | 22 | 23 | 24 | 25 | 26 | 27 |
| Retardation (nm) |  | 1500 | 2000 | 3000 | 4100 | 6000 | 8200 | 9000 | 10000 |
| Color shade (visual observation) | Parallel Nicols | Poor | Poor | Adequate | Adequate | Good | Good | Excellent | Excellent |
|  | Crossed Nicols | Poor | Poor | Adequate | Adequate | Good | Good | Excellent | Excellent |
|  | Determination of color difference | Poor | Poor | Good | Good | Good | Good | Excellent | Excellent |

TABLE 4-continued

| Light transmittance at a wavelength of 605 nm Color rendering properties | Parallel Nicols Crossed Nicols | 2 98 Poor | 41 59 Poor | 94 6 Poor | 42 58 Poor | 77 23 Poor | 3 97 Poor | 53 47 Poor | 9 91 Poor |
|---|---|---|---|---|---|---|---|---|---|

| | | Comparative Examples | | | | |
|---|---|---|---|---|---|---|
| | | 28 | 29 | 30 | 31 | 32 |
| Retardation (nm) | | 11500 | 12980 | 25200 | 33000 | 101000 |
| Color shade (visual observation) | Parallel Nicols | Excellent | Excellent | Excellent | Excellent | Excellent |
| | Crossed Nicols | Excellent | Excellent | Excellent | Excellent | Excellent |
| | Determination of color difference | Excellent | Excellent | Excellent | Excellent | Excellent |
| Light transmittance at a wavelength of 605 nm | Parallel Nicols | 82 | 38 | 26 | 86 | 21 |
| | Crossed Nicols | 18 | 62 | 74 | 14 | 79 |
| Color rendering properties | | Poor | Poor | Poor | Poor | Poor |

| | | Reference Examples | | | | | |
|---|---|---|---|---|---|---|---|
| | | 5 | 6 | 7 | 8 | 9 | 10 |
| Retardation (nm) | | 4100 | 9000 | 10000 | 11500 | 33000 | 101000 |
| Color shade (visual observation) | Parallel Nicols | Poor | Excellent | Poor | Excellent | Poor | Good |
| | Crossed Nicols | Adequate | Poor | Excellent | Poor | Excellent | Good |
| | Determination of color difference | Poor | Poor | Poor | Poor | Poor | Excellent |
| Light transmittance at a wavelength of 630 nm | Parallel Nicols | 13 | 100 | 5 | 91 | 14 | 49 |
| | Crossed Nicols | 87 | 0 | 95 | 9 | 86 | 51 |
| Color rendering properties | | Good | Good | Good | Good | Good | Good |

The image display devices according to the examples each had excellent color rendering properties because light incident on the optical film provided at least 50% coverage of ITU-R BT.2020. In addition, blackout did not occur because the optical film had a retardation of 3000 nm or more and the optical film and the polarizer were disposed to form an angle of about 45° between the slow axis of the optical film and the absorption axis of the polarizer. As shown in Table 4, the optical film had a light transmittance of 20 to 80% at a wavelength of 630 nm, so that the occurrence of interference colors was also reduced, and the color difference was evaluated with excellent results.

As shown in Table 4, the image display devices according to Reference Examples 5 to 9 each had excellent color rendering properties and blackout did not occur; however, unfortunately, interference colors and color difference were observed because the optical film had a light transmittance outside the range of 20 to 80% at a wavelength of 630 nm.

The results of the examples and Reference Examples 5 to 9 confirm that the color rendering properties were excellent when light incident on the optical film provided at least 50% coverage of ITU-R BT.2020, and blackout was eliminated when the optical film had a retardation of 3000 nm or more and the optical film and the polarizer were disposed to form an angle of about 45° between the slow axis of the optical film and the absorption axis of the polarizer. However, in the case of the light sources including KSF phosphor that emits light having a narrow half width of the emission spectrum in the red region, the optical film needed to have a light transmittance of 20 to 80% at a wavelength of 630 nm in order to reliably eliminate interference colors.

The image display device according to Reference Example 10 had excellent results in terms of color rendering properties, blackout, interference colors, and color difference. However, the optical film was too thick (1010 μm) and unsuitable for practical use. Table 5 shows the relationship between birefringence of the optical film and its thickness.

In contrast, as for the image display devices according to the comparative examples, interference colors were unfortunately observed when the retardation of the optical film was less than 3000 nm (Comparative Examples 18, 19, 20, and 21). In the image display devices according to Comparative Examples 22 to 32, the emission spectrum of light incident on the optical film had a wide half width in the red region. Thus, interference colors, blackout, and color difference were prevented even when the light transmittance at a wavelength of 605 nm was outside the range of 20 to 80%, as long as the optical film had a retardation of 3000 nm or more and the optical film and the polarizer were disposed to form an angle of about 45° between the slow axis of the optical film and the absorption axis of the polarizer; however, the light incident on the optical film provided lower than 50% coverage of ITU-R BT.2020, so that the color rendering properties were poor.

TABLE 5

| Phase difference/nm | Film thickness (μm) |
|---|---|
| 1500 | 15 |
| 2000 | 20 |
| 3000 | 30 |
| 4100 | 41 |
| 6000 | 60 |
| 8200 | 82 |
| 9000 | 90 |
| 10000 | 100 |
| 11500 | 115 |
| 12980 | 129.8 |
| 13300 | 133 |
| 25200 | 252 |
| 28000 | 280 |
| 28300 | 283 |
| 33000 | 330 |
| 36000 | 360 |
| 41300 | 413 |
| 101000 | 1010 |
| 101400 | 1014 |

INDUSTRIAL APPLICABILITY

Owing to the structure described above, the image display device of the present invention can include an optical film having a thickness suitable for practical use in devices for which thickness reduction is required, without including any special inorganic material, wherein the image display device has high color rendering properties and is capable of minimizing the occurrence of blackout and interference colors (rainbow unevenness) even when the image display device includes light sources that emit light having a narrow emission spectrum.

The invention claimed is:

1. An image display device comprising:
   an optical film having an in-plane birefringence;
   a polarizer; and
   a light source configured to produce light that is incident on the optical film,
   wherein the optical film and the polarizer are disposed to form an angle of about 45° between a slow axis of the optical film and an absorption axis of the polarizer,
   the optical film is towards a viewer side of the image display device relative to the polarizer,
   the optical film has a retardation of 3,000 nm to 50,000 nm,
   the light incident on the optical film provides at least 50% coverage of ITU-R BT.2020, and has a peak in each of the following regions of the emission spectrum: a red region with a wavelength range from 580 nm to 780 nm; a green region with a wavelength range from 480 nm to less than 580 nm; and a blue region with a wavelength range from 380 nm to less than 480 nm, and
   the half width of the emission spectral peak in the red region is 70 nm or less, the half width of the emission spectral peak in the green region is 60 nm or less, and the half width of the emission spectral peak in the blue region is 40 nm or less.

2. The image display device according to claim 1, wherein the optical film has a light transmittance of 20% or higher at a wavelength of a maximum peak intensity in a wavelength range from 580 nm to 780 nm.

3. The image display device according to claim 1, wherein the optical film has a light transmittance of 20 to 80% at a wavelength of a maximum peak intensity in a wavelength range from 580 nm to 780 nm.

4. The image display device according to claim 1, wherein the light source includes a blue light-emitting diode, a red phosphor, and a green and/or yellow phosphor, and
   the red phosphor is a fluoride complex phosphor activated with $Mn^{4+}$.

5. The image display device according to claim 1, wherein the light source includes an organic electroluminescence element.

6. The image display device according to claim 1, wherein the half width of the emission spectral peak in the red region is 60 nm or less, the half width of the emission spectral peak in the green region is 50 nm or less, and the half width of the emission spectral peak in the blue region is 30 nm or less.

* * * * *